US011990878B2

United States Patent
Kojima

(10) Patent No.: US 11,990,878 B2
(45) Date of Patent: May 21, 2024

(54) POWER SUPPLY CIRCUIT

(71) Applicant: Mitsubishi Electric Corporation, Tokyo (JP)

(72) Inventor: Tomokazu Kojima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 512 days.

(21) Appl. No.: 17/422,921

(22) PCT Filed: Feb. 21, 2019

(86) PCT No.: PCT/JP2019/006622
§ 371 (c)(1),
(2) Date: Jul. 14, 2021

(87) PCT Pub. No.: WO2020/170394
PCT Pub. Date: Aug. 27, 2020

(65) Prior Publication Data
US 2022/0094316 A1    Mar. 24, 2022

(51) Int. Cl.
*H03F 3/45*    (2006.01)
*G05F 1/46*    (2006.01)

(52) U.S. Cl.
CPC ......... *H03F 3/45183* (2013.01); *G05F 1/461* (2013.01)

(58) Field of Classification Search
CPC ........................................................ H03F 3/45
USPC ........................................ 330/261, 260, 51
See application file for complete search history.

(56) References Cited

U.S. PATENT DOCUMENTS

| 7,714,651 B2 * | 5/2010 | Bapat ........................ H03F 3/72 330/253 |
| 11,329,619 B2 * | 5/2022 | Nomura ............. H03F 3/45766 |
| 2021/0265962 A1 * | 8/2021 | Nomura ............. H03F 3/45766 |

FOREIGN PATENT DOCUMENTS

| JP | 2005092693 A | 4/2005 |
| JP | 2009266121 A | 11/2009 |

OTHER PUBLICATIONS

International Search Report (PCT/ISA/210) with translation and Written Opinion (PCT/ISA/237) dated May 14, 2019, by the Japan Patent Office as the International Searching Authority for International Application No. PCT/JP2019/006622.

* cited by examiner

*Primary Examiner* — Henry Choe
(74) *Attorney, Agent, or Firm* — BUCHANAN INGERSOLL & ROONEY PC

(57) ABSTRACT

A differential amplifying unit includes a first input transistor and a second input transistor forming a differential pair, and a first tail current source and a second tail current source. An output stage includes a first output transistor and a second output transistor that can be driven by an output of the differential amplifying unit. A controller performs control such that during startup, a load is driven by the first tail current source and the first output transistor, and such that after startup, the load is driven by the first tail current source, the second tail current source, the first output transistor, and the second output transistor.

17 Claims, 11 Drawing Sheets

POWER SUPPLY CIRCUIT

TECHNICAL FIELD

The present invention relates to a power supply circuit.

BACKGROUND ART

An efficient circuit having a high driving capability and low self-power consumption is required for a power supply circuit. Meanwhile, a driving element of high capability is required to improve the driving capability. Unfortunately, due to its high current driving capability, the driving element of high capability causes a rush current during startup and an overshoot of an output voltage.

Therefore, a power supply circuit is known that has the function of switching a capability of an output transistor (for example, see PTL 1). During startup, the power supply circuit reduces the capability of the output transistor to prevent an overshoot and a rush current. Once an output voltage reaches near a target voltage, the power supply circuit increases the capability of the output transistor.

With such control, it is possible to reduce a current driving capability during startup of the power supply circuit, and to provide a necessary and sufficient current driving capability during operation of the power supply circuit.

CITATION LIST

Patent Literature

PTL 1: Japanese Patent Laying-Open No. 2009-266121

SUMMARY OF INVENTION

Technical Problem

In the power supply circuit of PTL 1, the capability of the output transistor is switched between the time of startup and the time of normal operation, to implement smooth startup and a high current capability after startup.

In the power supply circuit of PTL 1, an amplifying circuit at a stage preceding the output transistor is unchanged in configuration and operation both during and after startup. An output impedance of the amplifier remains the same during and after startup, resulting in the power supply circuit being unable to supply a stable voltage.

Therefore, an object of the present invention is to provide a power supply circuit capable of implementing smooth startup and a high current capability after startup, and of supplying a stable voltage.

Solution to Problem

A power supply circuit of the present invention includes: a differential amplifying unit including a first input transistor and a second input transistor forming a differential pair, and a first tail current source and a second tail current source; an output stage including a first output transistor and a second output transistor that can be driven by an output of the differential amplifying unit; and a controller to perform control such that during startup, a load is driven by the first tail current source and the first output transistor, and such that after startup, the load is driven by the first tail current source, the second tail current source, the first output transistor, and the second output transistor.

Advantageous Effects of Invention

According to the present invention, during startup, the load is driven by the first tail current source and the first output transistor, and after startup, the load is driven by the first tail current source, the second tail current source, the first output transistor, and the second output transistor. Accordingly, smooth startup and a high current capability after startup can be implemented, and a stable voltage can be supplied.

DESCRIPTION OF EMBODIMENTS

In the following, embodiments will be described with reference to the drawings.

Embodiment 1

Figure 1:
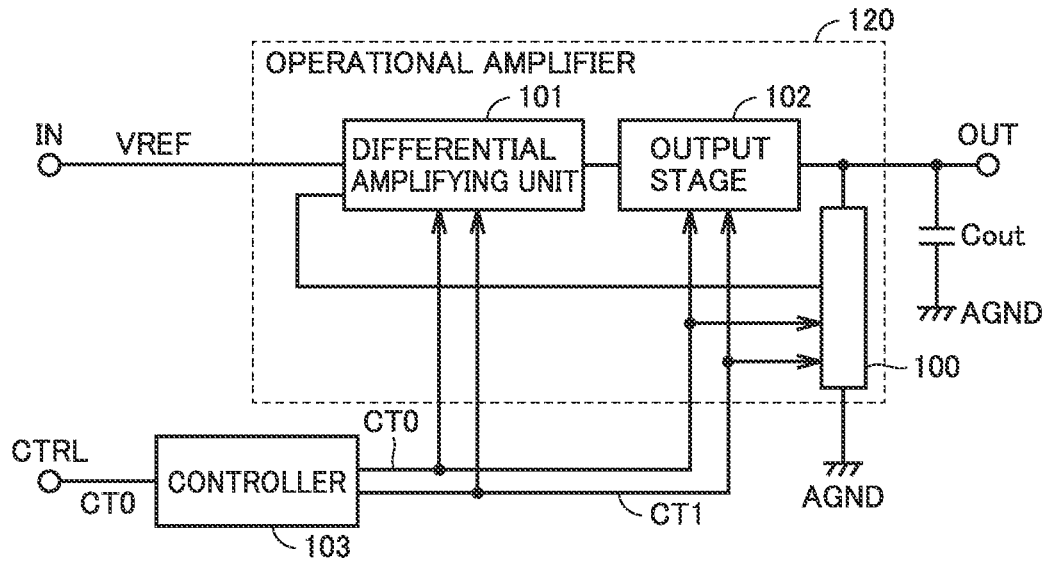
FIG. 1 is a diagram representing a configuration of a power supply circuit in Embodiment 1.

FIG. 1 is a diagram representing a configuration of a power supply circuit in Embodiment 1.

This power supply circuit includes an input terminal IN, a control terminal CTRL, an output terminal OUT, an operational amplifier 120, an output capacitance Cout, and a controller 103.

Operational amplifier 120 amplifies an input voltage VREF that is input through input terminal IN depending on a feedback resistance ratio, to generate an output voltage VOUT. Operational amplifier 120 includes a differential amplifying unit 101, an output stage 102, and a feedback resistor unit 100. Controller 103 receives an input control signal CT0 and outputs a startup completion control signal CT1. Input control signal CT0 is transmitted to each component of operational amplifier 120 through controller 103, and controls setting of a low power consumption mode of each component of operational amplifier 120. Startup of operational amplifier 120 is controlled by startup completion control signal CT1 from controller 103, and output capacitance Cout.

Figure 2:
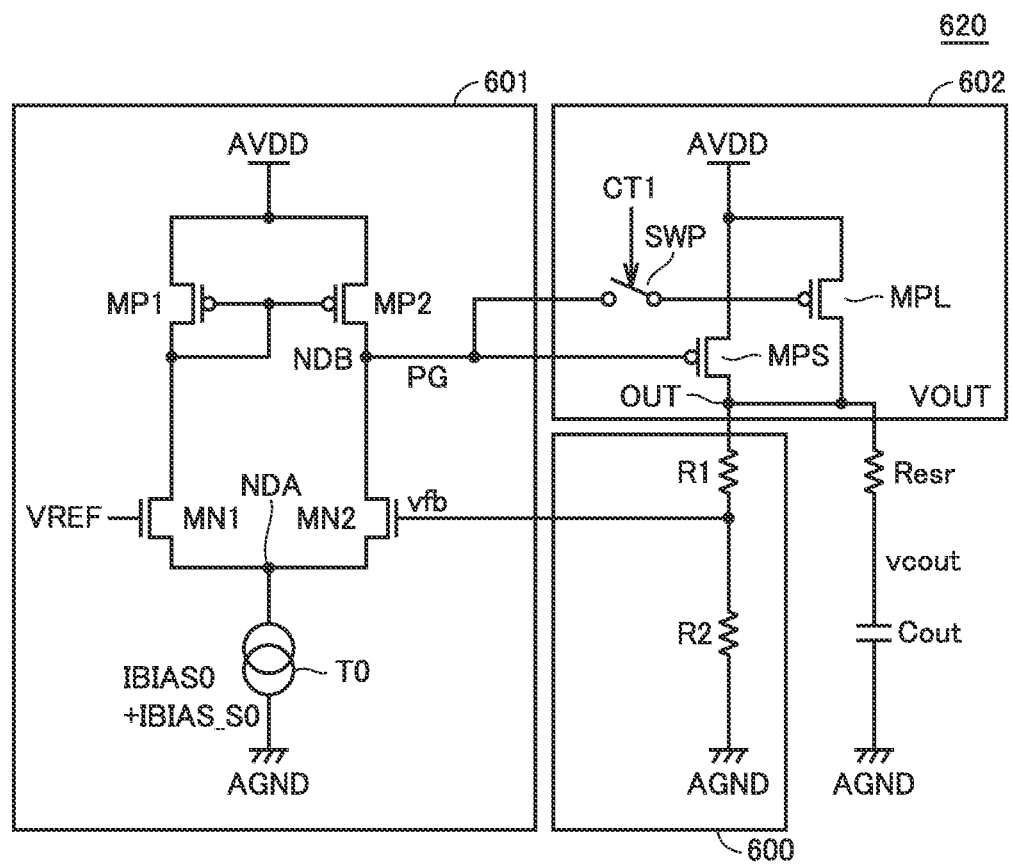
FIG. 2 is a diagram representing a configuration of an operational amplifier 620 in a reference example.

FIG. 2 is a diagram representing a configuration of an operational amplifier 620 in a reference example.

Operational amplifier 620 in the reference example includes a differential amplifying unit 601, an output stage 602, and a feedback resistor unit 600.

Differential amplifying unit 601 includes NMOS transistors MN1 and MN2 forming a differential pair, PMOS transistors MP1 and MP2 forming an active load, and a tail current source T0.

PMOS transistor MP1 and NMOS transistor MN1 are connected in series between a power supply AVDD and a node NDA. PMOS transistor MP2 and NMOS transistor MN2 are connected in series between power supply AVDD and node NDA.

The gate of PMOS transistor MP1, the drain of PMOS transistor MP1, and the gate of PMOS transistor MP2 are connected to one another.

The gate of NMOS transistor MN1 receives an input voltage VREF. The gate of NMOS transistor MN2 receives a feedback voltage vfb from feedback resistor unit 600.

A node NDB between PMOS transistor MP2 and NMOS transistor MN2 transmits a gate voltage PG to output stage 602.

Tail current source T0 is disposed between node NDA and a ground power supply AGND. Tail current source T0 outputs a tail current IBIAS0+IBIAS_S0.

Output stage 602 includes PMOS transistors MPL and MPS which are output transistors, and a switch SWP.

PMOS transistor MPS and PMOS transistor MPL are disposed in parallel between a power supply AVDD and an output terminal OUT. The gate of PMOS transistor MPS is connected to node NDB and receives gate voltage PG.

Switch SWP is disposed between node NDB and the gate of PMOS transistor MPL. The gate of PMOS transistor MPL receives gate voltage PG when switch SWP is ON. Switch SWP is controlled by startup completion control signal CT1. Switch SWP is turned on when startup completion control signal CT1 is at high level. Switch SWP is turned off when startup completion control signal CT1 is at low level.

Feedback resistor unit 600 includes feedback resistors R1 and R2.

Resistor R1 and resistor R2 are connected in series between output terminal OUT and ground power supply AGND.

Figure 3:
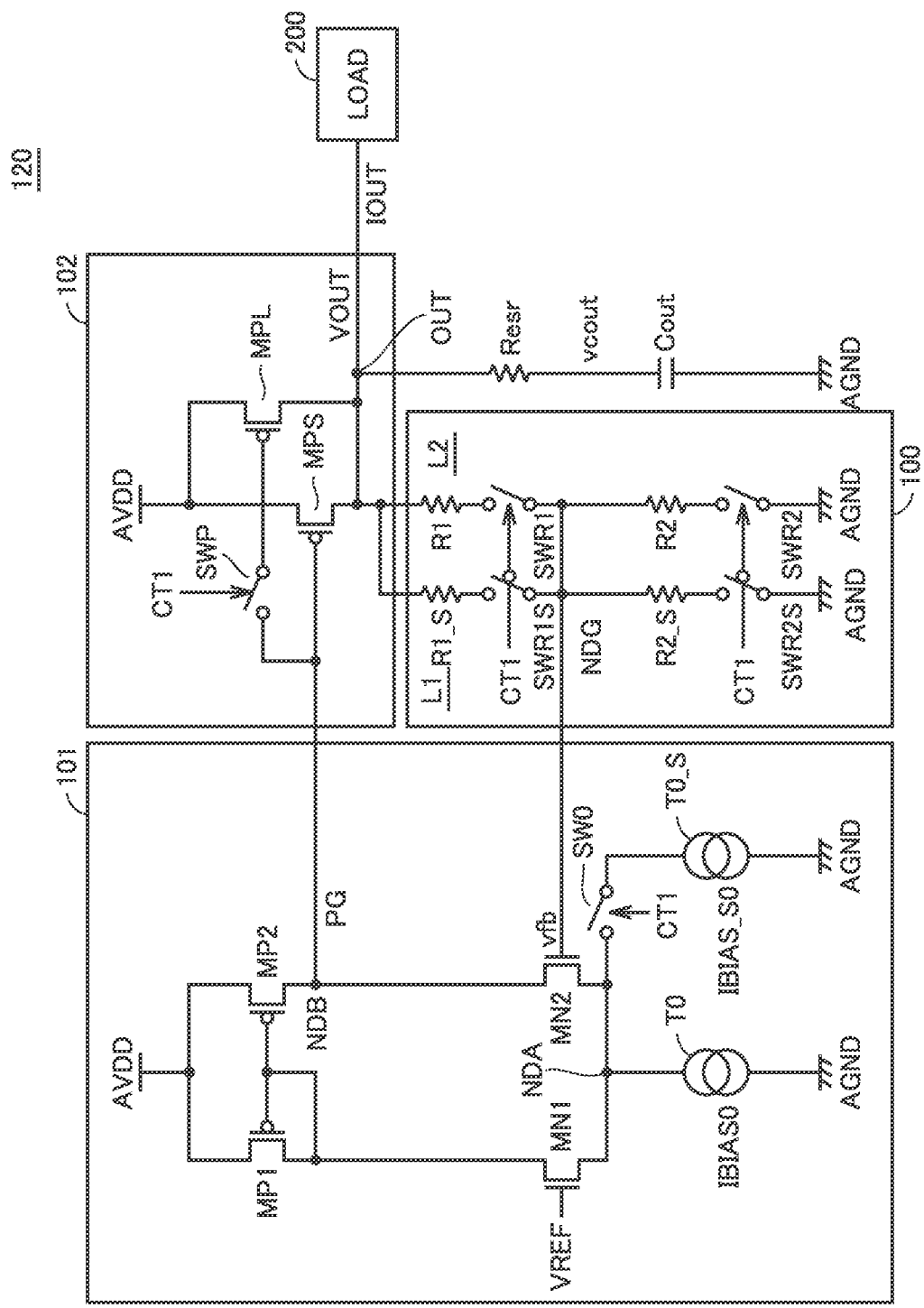
FIG. 3 is a diagram representing a configuration of an operational amplifier 120 in Embodiment 1.

FIG. 3 is a diagram representing a configuration of operational amplifier 120 in Embodiment 1.

Operational amplifier 120 includes differential amplifying unit 101, output stage 102, and feedback resistor unit 100.

Differential amplifying unit 101 includes an NMOS transistor MN1 (first input transistor) and an NMOS transistor MN2 (second input transistor) forming a differential pair, and PMOS transistors MP1 and MP2 forming an active load. Differential amplifying unit 101 further includes a tail current source T0 (first tail current source), a tail current source T0_S (second tail current source), and a switch SW0 (second switch).

PMOS transistor MP1 and NMOS transistor MN1 are connected in series between a power supply AVDD (first power supply) and a node NDA (first node). PMOS transistor MP2 and NMOS transistor MN2 are connected in series between power supply AVDD and node NDA. One end of NMOS transistor MN1 and one end of NMOS transistor MN2 are connected to node NDA.

The gate of PMOS transistor MP1, the drain of PMOS transistor MP1, and the gate of PMOS transistor MP2 are connected to one another.

The gate of NMOS transistor MN1 receives input voltage VREF. The gate of NMOS transistor MN2 receives a feedback voltage vfb from feedback resistor unit 100.

A node NDB between PMOS transistor MP2 and NMOS transistor MN2 transmits a gate voltage PG to output stage 102.

Tail current source T0 is disposed between node NDA and a ground power supply AGND (second power supply). Tail current source T0 outputs a tail current IBIAS0.

Switch SW0 and tail current source T0_S are connected in series between node NDA and ground power supply AGND. Tail current source T0_S outputs a tail current IBIAS_S0. Switch SW0 is controlled by startup completion control signal CT1. Switch SW0 is turned on when startup completion control signal CT1 is at high level. Switch SW0 is turned off when startup completion control signal CT1 is at low level.

Output stage 102 includes a PMOS transistor MPS (first output transistor) and a PMOS transistor MPL (second output transistor) which are output transistors, and a switch SWP (first switch). PMOS transistor MPL is greater in size than PMOS transistor MPS.

PMOS transistor MPS is disposed between power supply AVDD and output terminal OUT. PMOS transistor MPL is disposed between power supply AVDD and output terminal OUT. The gate of PMOS transistor MPS is connected to node NDB and receives gate voltage PG.

Switch SWP is disposed between node NDB and the gate of PMOS transistor MPL. The gate of PMOS transistor MPL receives gate voltage PG when switch SWP is ON. Switch SWP is controlled by startup completion control signal CT1. Switch SWP is turned on when startup completion control signal CT1 is at high level. Switch SWP is turned off when startup completion control signal CT1 is at low level.

Feedback resistor unit 100 feeds back a voltage determined by dividing a voltage of output terminal OUT to differential amplifying unit 101. Feedback resistor unit 100 includes a first path L1 and a second path L2.

Controller 103 performs control such that during startup, a current flows through first path L1, and a current does not flow through second path L2. Controller 103 performs control such that after startup, a current flows through second path L2, and a current does not flow through first path L1. First path L1 has lower resistance than second path L2.

Feedback resistor unit 100 includes a feedback resistor R1_S (first resistor), a feedback resistor R1 (second resistor), a feedback resistor R2_S (third resistor), and a feedback resistor R2 (fourth resistor).

Feedback resistor unit 100 further includes a switch SWR1S (fifth switch), a switch SWR1 (sixth switch), a switch SWR2S (seventh switch), and a switch SWR2 (eighth switch). Feedback resistor R1_S has a lower resistance value than feedback resistor R1. Feedback resistor R2_S has a lower resistance value than feedback resistor R2.

Feedback resistor R1 and feedback resistor R1_S are disposed in parallel between output terminal OUT and a node NDG (second node). Feedback resistor R2 and feedback resistor R2_S are disposed in parallel between node NDG and ground power supply AGND. A voltage vfg of node NDG is transmitted to the gate of NMOS transistor MN2 of differential amplifying unit 101.

Switch SWR1S is disposed between feedback resistor R1_S and node NDG. Switch SWR1 is disposed between feedback resistor R1 and node NDG. Switch SWR2S is disposed between feedback resistor R2_S and ground power supply AGND. Switch SWR2 is disposed between feedback resistor R2 and ground power supply AGND.

Switches SWR1 and SWR2 are controlled by startup completion control signal CT1. Switches SWR1 and SWR2 are turned on when startup completion control signal CT1 is at high level. Switches SWR1 and SWR2 are turned off when startup completion control signal CT1 is at low level. Switches SWR1S and SWR2S are controlled by startup completion control signal CT1. Switches SWR1S and SWR2S are turned off when startup completion control signal CT1 is at high level. Switches SWR1S and SWR2S are turned on when startup completion control signal CT1 is at low level. Accordingly, during startup, a current flows through feedback resistor R1_S and feedback resistor R2_S on first path L1, and a current does not flow through feedback resistor R1 and feedback resistor R2 on second path L2. After startup, a current flows through feedback resistor R1 and feedback resistor R2 on second path L2, and a current does not flow through feedback resistor R1_S and feedback resistor R2_S on first path L1.

Figure 4:
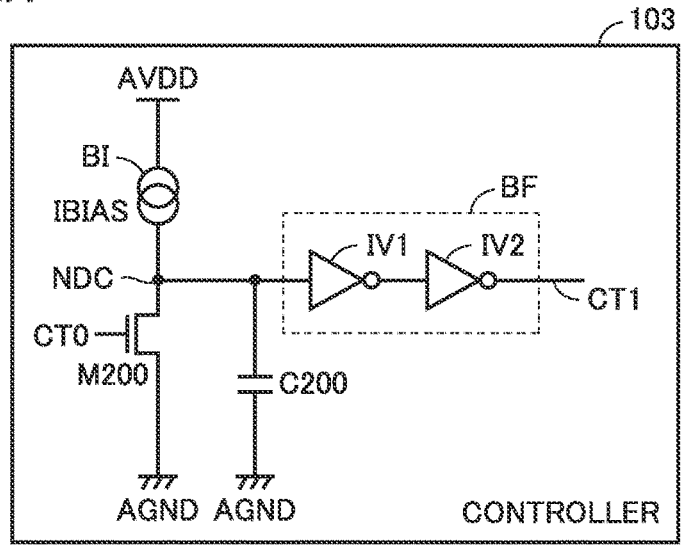
FIG. 4 is a diagram representing a configuration of a controller 103.

FIG. 4 is a diagram representing a configuration of controller 103.

Controller 103 includes an NMOS transistor M200, a capacitance element C200, a bias current source BI, and a buffer BF. Buffer BF includes an inverter IV1 and an inverter IV2.

Bias current source BI is disposed between power supply AVDD and a node NDC (third node). Bias current source BI outputs a bias current IBIAS.

NMOS transistor M200 (drive transistor) is disposed between node NDC and ground power supply AGND. The gate of NMOS transistor M200 receives input control signal CT0.

Capacitance element C200 is disposed between node NDC and ground power supply AGND.

Inverter IV1 receives a voltage of node NDC. An output of inverter IV1 is connected to an input of inverter IV2. Inverter IV2 outputs startup completion control signal CT1. Switches SW0, SWP, SWR1, SWR2, SWR1S and SWR2S included in differential amplifying unit 101, output stage 102, and feedback resistor unit 100 are controlled by startup completion control signal CT1.

Figure 5A:
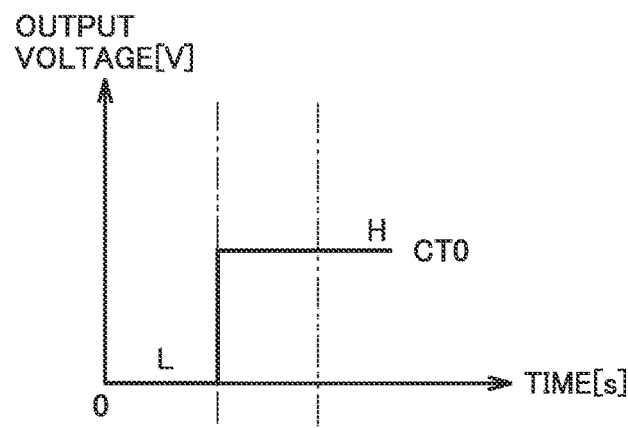
FIG. 5 (a) is a diagram representing a change with time of an input control signal CT0, and FIG. 5 (b) is a diagram representing a change with time of a startup completion control signal CT1.
Figure 5B:
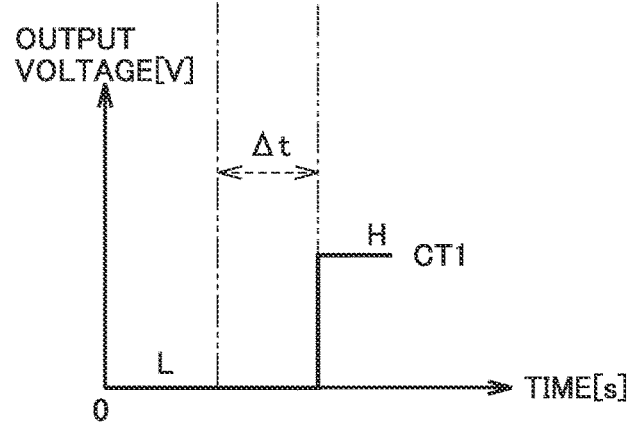

FIG. 5 (*a*) is a diagram representing a change with time of input control signal CT0. FIG. 5 (*b*) is a diagram representing a change with time of startup completion control signal CT1.

In an initial state, input control signal CT0 is at low level. At this time, NMOS transistor M200 is in the OFF state, and therefore, the voltage of node NDC, which is a drain voltage of NMOS transistor M200, is at a level substantially close to power supply voltage AVDD. In this state, a low-level voltage is input to inverter IV1, causing startup completion control signal CT1 that is output from inverter IV2 to be at low level.

When input control signal CT0 changes from low level to high level, NMOS transistor M200 is turned on, causing the voltage of node NDC, which is a drain voltage of NMOS transistor M200, to gradually change from a power supply voltage AVDD level to an AGND level.

Here, a time $\Delta t$ from when input control signal CT0 changes to high level to when startup completion control signal CT1 changes to high level is expressed by the following equation, where IBIAS represents a current of bias current source BI, and C200 represents a capacitance value of capacitance element C200:

$$\Delta V = \text{AVDD} - \text{AGND} \tag{A1}$$

$$\Delta t = C200 \times \Delta V / \text{IBIAS} \tag{A2}$$

Controller 103 brings startup completion control signal CT1 to low level in the initial state (during startup), and brings startup completion control signal CT1 to high level after startup. In other words, a time during which startup completion signal CT1 is at low level is "during startup," and a time during which startup completion signal CT1 is at high level is "after startup."

During startup, controller 103 turns off switch SW0, turns off switch SWP, turns off switches SWR1 and SWR2, and turns on switches SWR1S and SWR2S. The result is that the tail current is formed only by IBIAS0, and only output transistor MPS is driven. As a result, a load 200 is driven by output transistor MPS and tail current source T0. A current flows from output terminal OUT through resistors R1_S and R2_S.

After startup, controller 103 turns on switch SW0, turns on switch SWP, turns on switches SWR1 and SWR2, and turns off SWR1S and SWR2S. The result is that the tail current is formed by IBIAS0+IBIAS_S0, and output transistors MPS and MPL are driven. As a result, load 200 is driven by output transistors MPS and MPL, and tail current sources T0 and T0_S. A current flows from output terminal OUT through resistors R1 and R2.

A driving capability of operational amplifier 120 in the initial state is determined by transistor MPS. As transistor MPS has a sufficiently lower capability than transistor MPL, a current capability during startup can be reduced.

The reference example provides only the function of switching the output transistors between high and low capabilities by switch SWP. If a ratio of sizes of output transistors MPS and MPL is set to about two to five times, for example, no significant problem arises.

In a device such as an IoT (Internet of Things) device of recent years, however, it is required to significantly reduce self-power consumption of operational amplifier 120 or the power supply circuit to a several [uA] to [nA] level. It is also required for power consumption during startup to be at a [uW] to [nW] level. Further, its driving capability is required to be at a several hundred [mA] to several [A] level.

In view of this situation, a transistor having a low capability needs to be selected as output transistor MPS, in order to suppress an inrush current during startup. Meanwhile, a transistor having a high capability needs to be selected as output transistor MPL, in order to improve the driving capability during normal use.

An absolute condition for an operational amplifier thus configured is that it outputs a stable voltage during use. If the sizes of output transistors MPS and MPL differ by a factor of ten or more, however, even the use of a design that achieves stability during use may, although stability may be achieved when output transistors MPL and MPL are selected, result in instability when only output transistor MPS is selected.

In the present embodiment, the output transistors are switched between high and low capabilities by switch SWP, the magnitude of the tail current is switched by switch SW0, and the magnitude of the current flowing through feedback resistor unit 100 is switched by switches SWR1, SWR2, SWR1S and SWR2S.

Figure 6A:
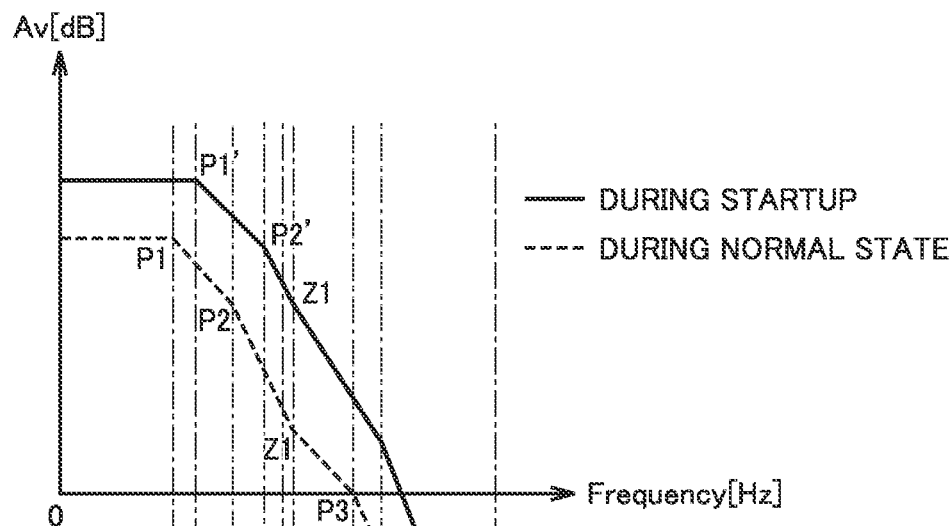
FIG. 6 (a) is a Bode diagram showing frequency response characteristics of operational amplifier 620 in the reference example, and FIG. 6 (b) is a Bode diagram showing frequency response characteristics of operational amplifier 120 in Embodiment 1.
Figure 6B:
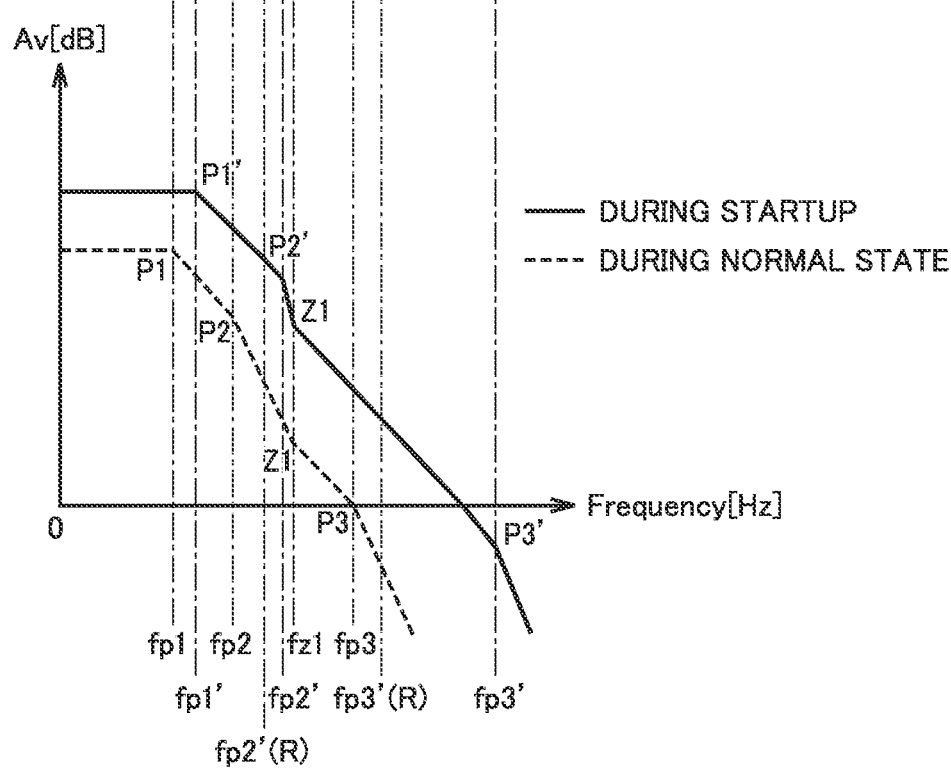

FIG. 6 (a) is a Bode diagram showing frequency response characteristics of operational amplifier 620 in the reference example.

A first pole P1 of operational amplifier 620 is arranged on a frequency fp1 after startup, and arranged on a frequency fp1' during startup:

$$fp1=\lambda IOUT/(2\pi Cout) \quad (1)$$

$$fp1'=\lambda' IOUT'(2\pi Cout) \quad (2)$$

Note that λ represents a channel length modulation coefficient determined by output transistors MPS and MPL. As output transistor MPS is smaller in size than output transistor MPL, λ is generally a channel length modulation coefficient of output transistor MPL. Note that λ' represents a channel length modulation coefficient of output transistor MPS, and IOUT and IOUT' represent currents flowing from output terminal OUT to load 200. As IOUT'>IOUT and λ'>λ are satisfied, fp1'>fp1 is satisfied. Note that Cout represents a capacitance value of output capacitance Cout.

A second pole P2 of operational amplifier 620 is arranged on a frequency fp2 after startup, and arranged on a frequency fp2' (R) during startup:

$$fp2=1/(2\pi(R1+R2)\times Cgate) \quad (3)$$

$$fp2'(R)=1/(2\pi(R1+R2)\times Cgate') \quad (4A)$$

Here, R1 and R2 represent resistance values of resistors R1 and R2, Cgate represents a parasitic capacitance, which is mainly a gate capacitance of output transistors MPL and MPS, and Cgate' represents a parasitic capacitance, which is mainly a gate capacitance of output transistor MPS. As Cgate>Cgate' is satisfied, fp2' (R)>fp2 is satisfied.

A third pole P3 of the operational amplifier is arranged on a frequency fp3 after startup, and arranged on a frequency fp3' (R) during startup:

$$fp3=1/(2\pi(Roa\times Cgate) \quad (5)$$

$$fp3'(R)=1/(2\pi(Roa\times Cgate') \quad (6A)$$

Here, Roa represents output impedances of transistors MP2 and MN2, and Roa is proportional to tail current IBIAS0+IBIAS_S0.

As Cgate>Cgate' is satisfied, fp3' (R)>fp3 is satisfied.

A zero Z1 of the operational amplifier is arranged on a frequency fz1 after startup and during startup:

$$fz1=1/(2\pi Resr\times Cout) \quad (7)$$

Here, Resr represents an ESR of output capacitance Cout.

FIG. 6 (b) is a Bode diagram showing frequency response characteristics of operational amplifier 120 in Embodiment 1.

A first pole P1 of operational amplifier 120 is arranged on a frequency fp1 after startup, and arranged on a frequency fp1' during startup:

$$fp1=\lambda IOUT/(2\pi Cout) \quad (1)$$

$$fp1'=\lambda' IOUT/(2\pi Cout) \quad (2)$$

Note that λ represents a channel length modulation coefficient determined by output transistors MPS and MPL. As output transistor MPS is smaller in size than output transistor MPL, λ is generally a channel length modulation coefficient of output transistor MPL. Note that λ' represents a channel length modulation coefficient of output transistor MPS, and IOUT and IOUT' represent currents flowing from output terminal OUT to load 200. As IOUT'>IOUT and λ'>λ are satisfied, fp1'>fp1 is satisfied. Note that Cout represents a capacitance value of output capacitance Cout.

A second pole P2 of the operational amplifier is arranged on a frequency fp2 after startup, and arranged on a frequency fp2' during startup:

$$fp2=1/(2\pi(R1+R2)\times Cgate) \quad (3)$$

$$fp2'=1/(2\pi(R1\_S+R2\_S)\times Cgate') \quad (4)$$

Here, R1, R2, R1_S and R2_S represent resistance values of resistors R1, R2, R1_S and R2_S, Cgate represents a parasitic capacitance, which is mainly a gate capacitance of output transistors MPL and MPS, and Cgate' represents a parasitic capacitance, which is mainly a gate capacitance of output transistor MPS. As R1>R1_S, R2>R2_S, and Cgate>Cgate' are satisfied, fp2'>fp2 and fp2'>fp2' (R) are satisfied.

A third pole P3 of the operational amplifier is arranged on a frequency fp3 after startup, and arranged on a frequency fp3' during startup:

$$fp3=1/(2\pi(Roa\times Cgate) \quad (5)$$

$$fp3'=1/(2\pi(Roa'\times Cgate') \quad (6)$$

Here, Roa and Roa' represent output impedances of transistors MP2 and MN2, Roa is proportional to tail current IBIAS0+IBIAS_S0, and Roa' is proportional to tail current IBIAS0.

As Roa>Roa' and Cgate>Cgate' are satisfied, fp3'>fp3 and fp3'>fp3' (R) are satisfied. As shown in FIG. 6 (b), fp3' is sufficiently greater than fp3. By setting a total gain A [db] to 0 [db] or less at fp3', a two-pole one-zero system can be implemented. As a result, adequate stability can be ensured.

A zero Z1 of the operational amplifier is arranged on a frequency fz1 after startup and during startup:

$$fz1=1/(2\pi Resr\times Cout) \quad (7)$$

Here, Resr represents an ESR of output capacitance Cout.

Figure 7:
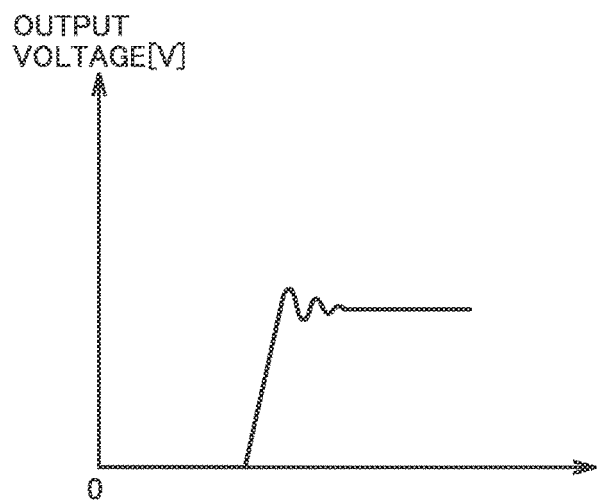
FIG. 7 is a diagram representing a waveform of an output voltage VOUT of operational amplifier 620 in the reference example.

FIG. 7 is a diagram representing a waveform of output voltage VOUT of operational amplifier 620 in the reference example.

In the reference example, output voltage VOUT includes ripples, SIN waves or the like.

Figure 8:
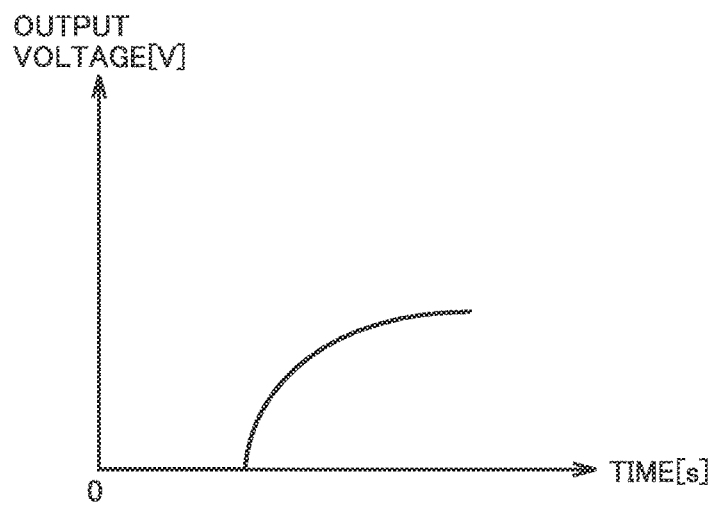
FIG. 8 is a diagram representing a waveform of an output voltage VOUT of operational amplifier 120 in Embodiment 1.

FIG. 8 is a diagram representing a waveform of output voltage VOUT of operational amplifier 120 in Embodiment 1.

In Embodiment 1, output voltage VOUT changes in a stable and smooth manner including during startup and after startup (during a normal state and a period of transition from startup to the normal state).

Figure 9:
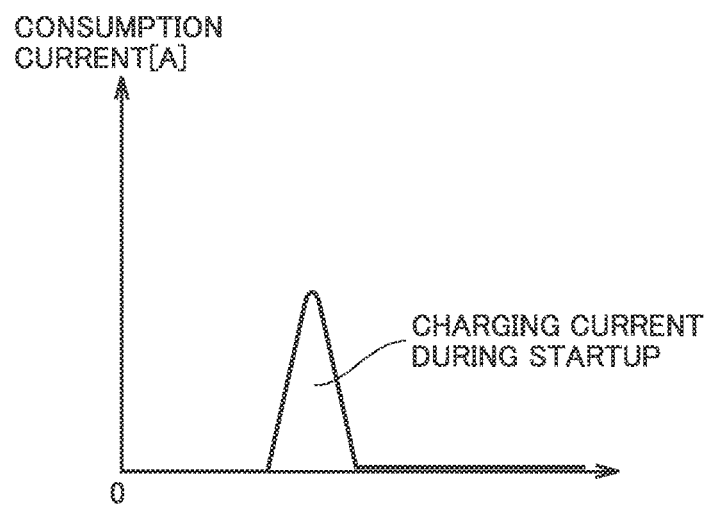
FIG. 9 is a diagram representing a waveform of a current consumed by a power supply circuit in the reference example.

FIG. 9 is a diagram representing a waveform of a current consumed by the power supply circuit in the reference example.

In the reference example, charging and discharging of output capacitance Cout is wasted due to variation in output voltage VOUT during startup. The effect cannot be sufficiently produced even if output transistor MPS having a reduced capability is used.

Figure 10:
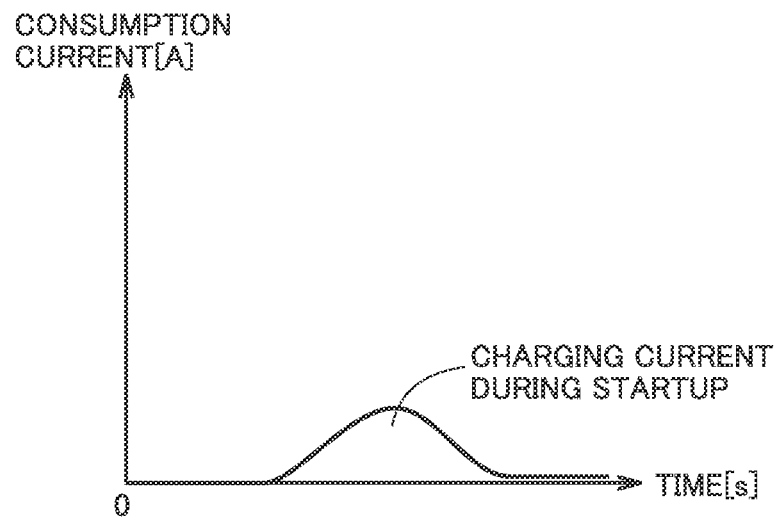
FIG. 10 is a diagram representing a waveform of a current consumed by the power supply circuit in Embodiment 1.

FIG. 10 is a diagram representing a waveform of a current consumed by the power supply circuit in Embodiment 1.

In Embodiment 1, charging and discharging of output capacitance Cout is not wasted, so that the consumption current can be reduced.

Embodiment 2

Figure 11:
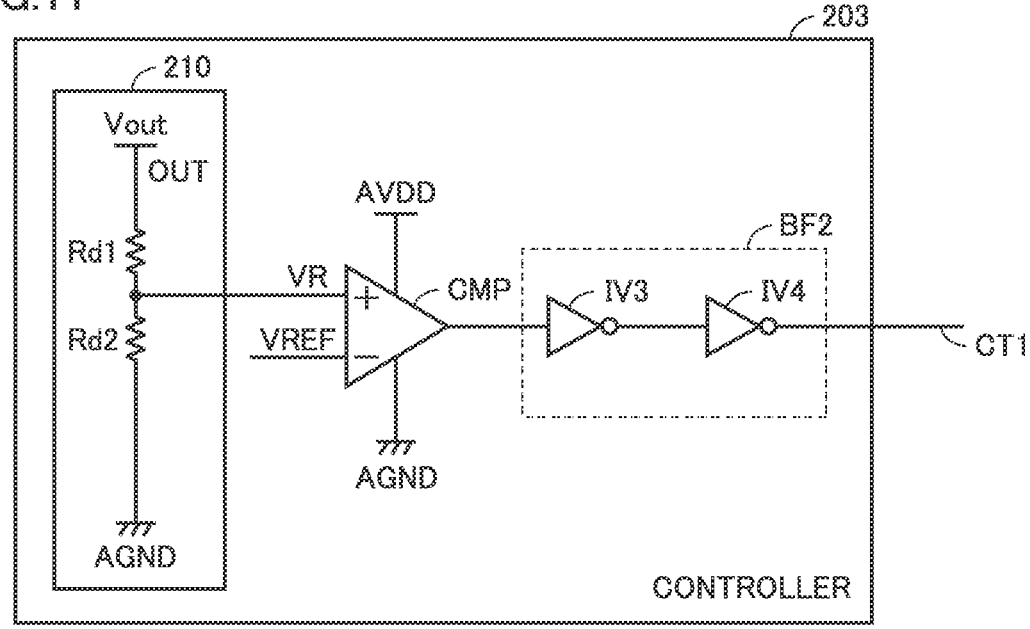
FIG. 11 is a diagram representing a configuration of a controller 203 in Embodiment 2.

FIG. 11 is a diagram representing a configuration of a controller 203 in Embodiment 2.

Controller 203 includes a voltage dividing unit 210, a comparator CMP, and a buffer BF2. Buffer BF2 includes an inverter IV3 and an inverter IV4.

Voltage dividing unit 210 divides output voltage VOUT to be supplied to load 200. Voltage dividing unit 210 includes a resistor Rd1 and a resistor Rd2 connected in series between output terminal OUT and ground power supply AGND.

Voltage dividing unit 210 outputs a divided voltage VR:

$$VR = VOUT \times Rd1/(Rd1+Rd2) \qquad (8)$$

Note that Rd1 represents a resistance value of resistor Rd1, and Rd2 represents a resistance value of resistor Rd2.

Comparator CMP compares divided voltage VR with input voltage VREF serving as a reference voltage. Comparator CMP outputs high level when VR VREF is satisfied. Comparator CMP outputs low level when VR<VREF is satisfied.

Inverter IV3 receives an output of comparator CMP. An output of inverter IV3 is connected to an input of inverter IV4. Inverter IV4 outputs startup completion control signal CT1. Switches SW0, SWP, SWR1, SWR2, SWR1S and SWR2S included in differential amplifying unit 101, output stage 102, and feedback resistor unit 100 are controlled by startup completion control signal CT1.

Embodiment 3

Figure 12:
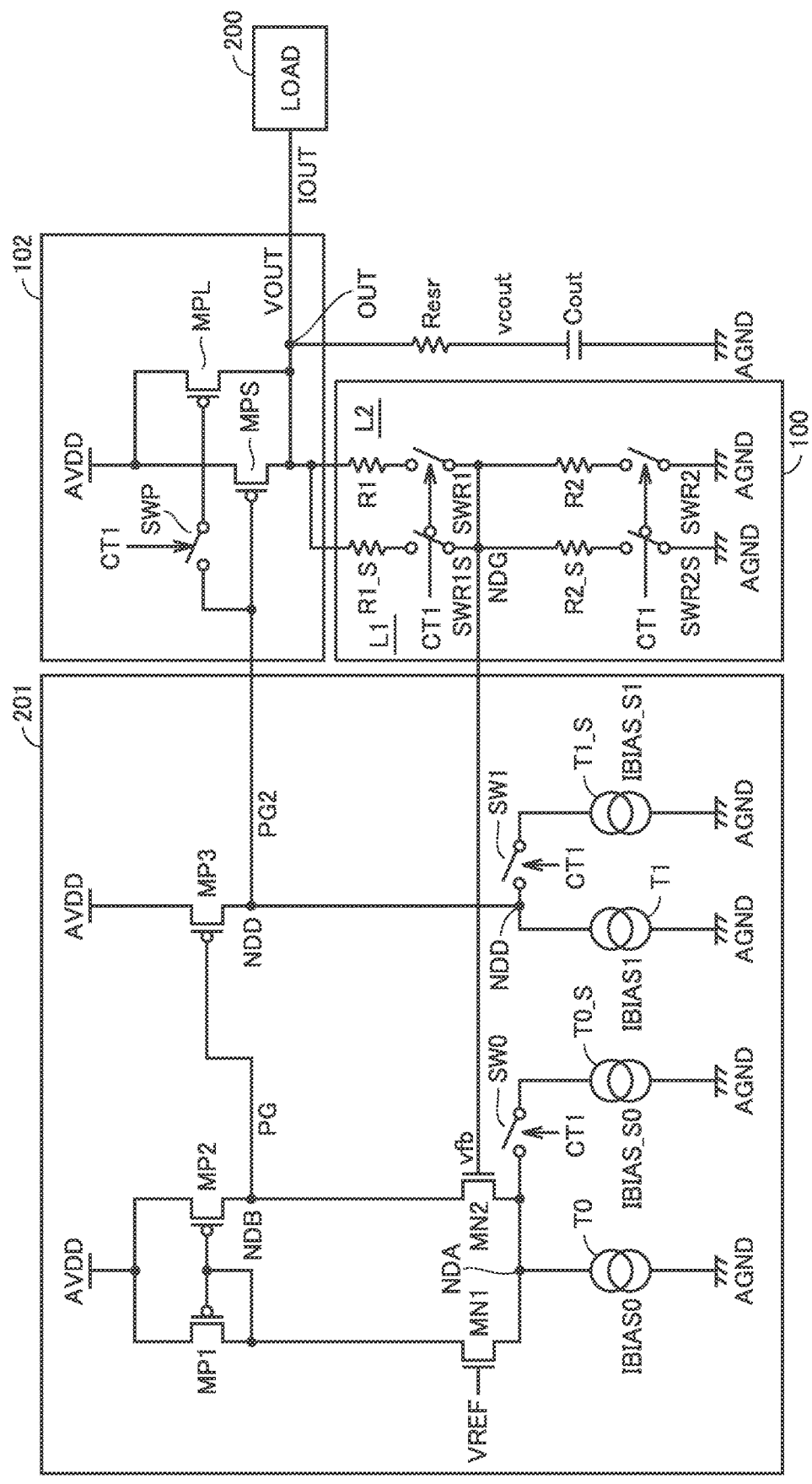
FIG. 12 is a diagram representing a configuration of an operational amplifier 220 in Embodiment 3.

FIG. 12 is a diagram representing a configuration of an operational amplifier 220 in Embodiment 3.

Operational amplifier 220 includes a differential amplifying unit 201, output stage 102, and feedback resistor unit 100. Output stage 102 and feedback resistor unit 100 are similar to those described in Embodiment 1, and therefore will not be described again.

Differential amplifying unit 201 includes, as in Embodiment 1, NMOS transistors MN1 and MN2 forming a differential pair, PMOS transistors MP1 and MP2 forming an active load, tail current sources T0 and T0_S, and switch SW0.

Differential amplifying unit 201 further includes a PMOS transistor MP3 forming a source ground circuit functioning as an amplifier, tail current sources T1 and T1_S, and a switch SW1.

PMOS transistor MP3 is disposed between power supply AVDD and a node NDD. The gate of PMOS transistor MP3 receives gate voltage PG of node NDB. Node NDD, to which the drain of PMOS transistor MP3 is connected, transmits a gate voltage PG2 to output stage 102. At output stage 102, the gate of PMOS transistor MPS is connected to node NDD and receives gate voltage PG2. Switch SWP is disposed between node NDD and the gate of PMOS transistor MPL. The gate of PMOS transistor MPL receives gate voltage PG2 when switch SWP is ON.

Tail current source T1 is disposed between node NDD and ground power supply AGND. Tail current source T1 outputs a tail current IBIAS1.

Switch SW1 and tail current source T1_S are connected between node NDD and ground power supply AGND. Tail current source T1_S outputs a tail current IBIAS_S1. Switch SW1 is controlled by startup completion control signal CT1. Switch SW1 is turned on when startup completion control signal CT1 is at high level. Switch SW1 is turned off when startup completion control signal CT1 is at low level.

During startup, controller 103 turns off switches SW0 and SW1, turns off switch SWP, turns off switches SWR1 and SWR2, and turns on switches SWR1S and SWR2S. The result is that the tail current is formed only by IBIAS0+IBIAS1, and only output transistor MPS is driven. A current flows from output terminal OUT through resistors R1_S and R2_S.

After startup, controller 103 turns on switches SW0 and SW1, turns on switch SWP, turns on switches SWR1 and SWR2, and turns off SWR1S and SWR2S. The result is that the tail current is formed by IBIAS0+IBIAS_S0+IBIAS1+IBIAS_S1, and output transistors MPS and MPL are driven. A current flows from output terminal OUT through resistors R1 and R2.

Values of IBIAS0 and IBIAS1 are determined depending on the specifications such as a band and a PSRR (Power Supply Rejection Ratio) of operational amplifier 220. Depending on the determined values, it may be sufficient to only switch one of switch SW0 and switch SW1 during a change from the time of startup to the time after startup. In such a case, only one of switch SW0 and switch SW1 may be switched, and the other switch may not be switched.

Embodiment 4

Figure 13:
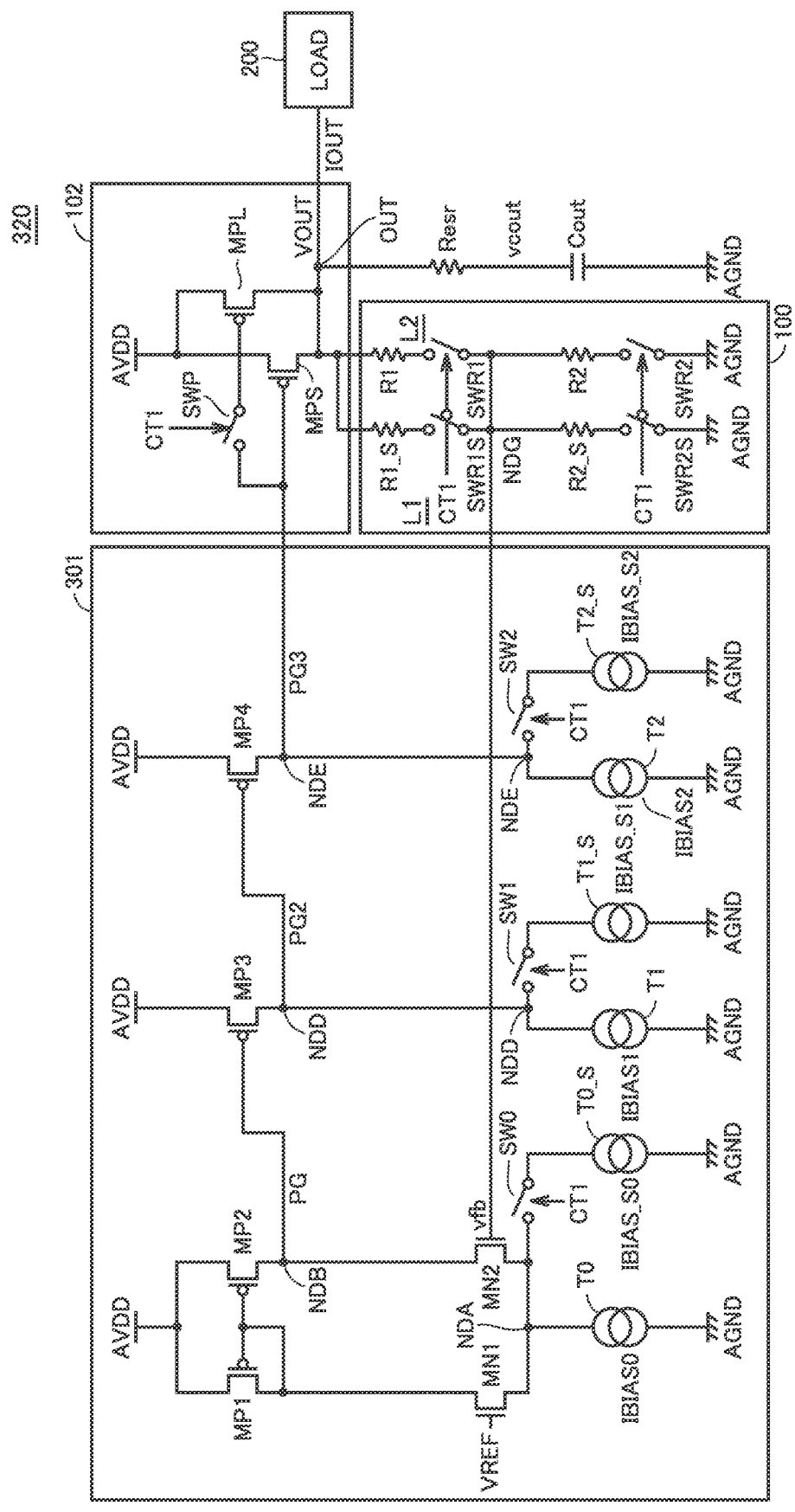
FIG. 13 is a diagram representing a configuration of an operational amplifier 320 in Embodiment 4.

FIG. 13 is a diagram representing a configuration of an operational amplifier 320 in Embodiment 4.

Operational amplifier 320 includes a differential amplifying unit 301, output stage 102, and feedback resistor unit 100. Output stage 102 and feedback resistor unit 100 are similar to those described in Embodiment 1, and therefore will not be described again.

Differential amplifying unit 301 includes, as in Embodiment 2, NMOS transistors MN1 and MN2 forming a differential pair, PMOS transistors MP1 and MP2 forming an active load, PMOS transistor MP3 forming a source ground circuit, tail current sources T0, T0_S, T1 and T1_S, and switches SW0 and SW1.

Differential amplifying unit 301 further includes a PMOS transistor MP4 forming a source ground circuit functioning as an amplifier, tail current sources T2 and T2_S, and a switch SW2.

PMOS transistor MP4 is disposed between power supply AVDD and a node NDE. The gate of PMOS transistor MP4 receives gate voltage PG2 of node NDD. Node NDE, to which the drain of PMOS transistor MP4 is connected, transmits a gate voltage PG3 to output stage 102. At output stage 102, the gate of PMOS transistor MPS is connected to node NDE and receives gate voltage PG3. Switch SWP is disposed between node NDE and the gate of PMOS transistor MPL. The gate of PMOS transistor MPL receives gate voltage PG3 when switch SWP is ON.

Tail current source T2 is disposed between node NDE and ground power supply AGND. Tail current source T2 outputs a tail current IBIAS2.

Switch SW2 and tail current source T2_S are connected between node NDE and ground power supply AGND. Tail current source T2_S outputs a tail current IBIAS_S2.

Switch SW2 is controlled by startup completion control signal CT1. Switch SW2 is turned on when startup completion control signal CT1 is at high level. Switch SW2 is turned off when startup completion control signal CT1 is at low level.

During startup, controller 103 turns off switches SW0, SW1 and SW2, turns off switch SWP, turns off switches SWR1 and SWR2, and turns on switches SWR1S and SWR2S. The result is that the tail current is formed only by IBIAS0+IBIAS1+IBIAS2, and only output transistor MPS is driven. A current flows from output terminal OUT through resistors R1_S and R2_S.

After startup, controller 103 turns on switches SW0, SW1 and SW2, turns on switch SWP, turns on switches SWR1 and SWR2, and turns off SWR1S and SWR2S. The result is that the tail current is formed by IBIAS0+IBIAS_S0+IBIAS1+IBIAS_S1+IBIAS2+IBIAS_S2, and output transistors MPS and MPL are driven. A current flows from output terminal OUT through resistors R1 and R2.

Values of IBIAS0, IBIAS1 and IBIAS are determined depending on the specifications such as a band and a PSRR of operational amplifier 320. Depending on the determined values, it may be sufficient to only switch one or two of switch SW0, switch SW1 and switch SW2 after startup. In such a case, only one or two of switch SW0, switch SW1 and switch SW2 may be switched, and the other switch(es) may not be switched.

In the embodiment described above, the differential amplifying unit further includes two stages of amplifiers MP3 and MP4 to receive the output of the differential pair, and a first group of tail current sources T1 and T2 each connected to a corresponding one of the amplifiers, and a second group of tail current sources T1_S and T2_S, each connected to a corresponding one of the amplifiers. Tail current sources T1_S and T2_S of the second group each supply the tail current when its corresponding switch is ON.

The controller performs control such that during startup, the load is driven by tail current source T0, and the first group of two tail current sources T1 and T2. The controller performs control such that after startup, the load is driven by tail current source T0, tail current source T0_S, the first group of two tail current sources T1 and T2, and the second group of two tail current sources T1_S and T2_S. A variation as described below is also encompassed, without being limited to the embodiment described above.

The differential amplifying unit further includes N stage(s) (N is a natural number equal to or greater than one) of amplifiers to receive the output of the differential pair, and N sets of a first group of tail current sources and a second group of tail current sources, each set connected to a corresponding one of the amplifiers. The tail current sources of the second group each supply the tail current when its corresponding switch is ON.

The controller performs control such that during startup, the load is driven by tail current source T0 and the first group of N tail current sources. The controller performs control such that after startup, the load is driven by tail current source T0, tail current source T0_S, the first group of N tail current sources, and the second group of M (N M) tail current source(s) of the second group of N tail current sources.

Embodiment 5

Figure 14:
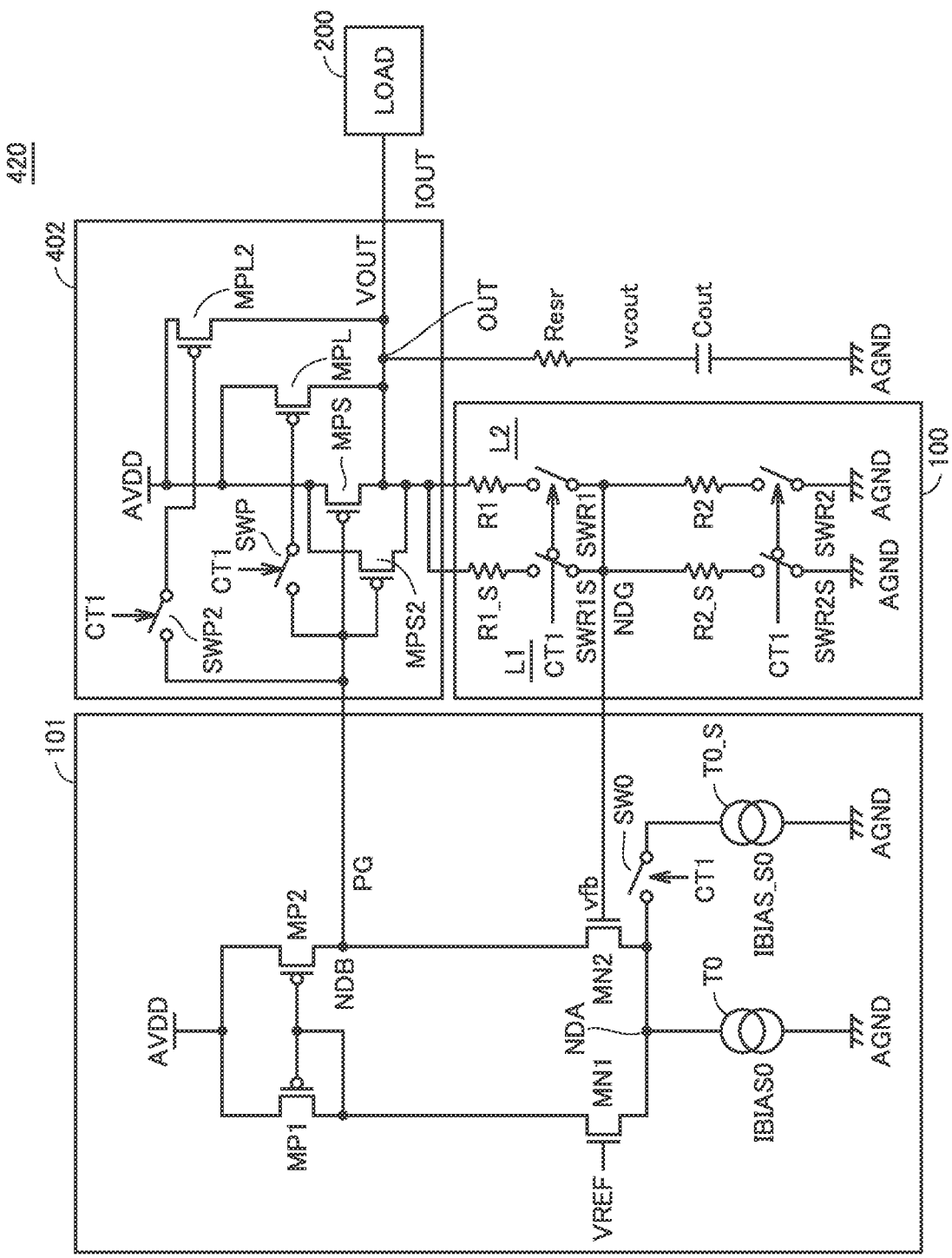
FIG. 14 is a diagram representing a configuration of an operational amplifier 420 in Embodiment 5.

FIG. 14 is a diagram representing a configuration of an operational amplifier 420 in Embodiment 5.

Operational amplifier 420 includes differential amplifying unit 101, an output stage 402, and feedback resistor unit 100. Differential amplifying unit 101 and feedback resistor unit 100 are similar to those described in Embodiment 1, and therefore will not be described again.

Output stage 402 includes PMOS transistors MPL, MPL2, MPS and MPS2 which are output transistors, and switches SWP and SWP2. PMOS transistor MPL is greater in size than PMOS transistor MPS. PMOS transistor MPL2 is greater in size than PMOS transistor MPS2.

PMOS transistor MPS, PMOS transistor MPS2, PMOS transistor MPL, and PMOS transistor MPL2 are disposed in parallel between power supply AVDD and output terminal OUT. The gate of PMOS transistor MPS is connected to node NDB and receives gate voltage PG. The gate of PMOS transistor MPS2 is connected to node NDB and receives gate voltage PG.

Switch SWP is disposed between node NDB and the gate of PMOS transistor MPL. Switch SWP2 is disposed between node NDB and the gate of PMOS transistor MPL2. The gate of PMOS transistor MPL receives gate voltage PG when switch SWP is ON. The gate of PMOS transistor MPL2 receives gate voltage PG when switch SWP2 is ON. Switches SWP and SWP2 are controlled by startup completion control signal CT1. Switches SWP and SWP2 are turned on when startup completion control signal CT1 is at high level. Switches SWP and SWP2 are turned off when startup completion control signal CT1 is at low level.

During startup, controller 103 turns off switch SW0, turns off switches SWP and SWP2, turns off switches SWR1 and SWR2, and turns on switches SWR1S and SWR2S. The result is that the tail current is formed only by IBIAS0, and only output transistors MPS and MPS2 are driven. As a result, load 200 is driven by output transistors MPS and MPS2, and tail current source T0. A current flows from output terminal OUT through resistors R1_S and R2_S.

After startup, controller 103 turns on switch SW0, turns on switches SWP and SWP2, turns on switches SWR1 and SWR2, and turns off SWR1S and SWR2S. The result is that the tail current is formed by IBIAS0+IBIAS_S0, and output transistors MPS, MPS2, MPL and MPL2 are driven. As a result, load 200 is driven by output transistors MPS, MPS2, MPL and MPL2, and tail current sources T0 and T0_S. A current flows from output terminal OUT through resistors R1 and R2.

In the embodiment described above, two transistors other than output transistors MPS and MPL are disposed in parallel between power supply AVDD and output terminal OUT. Controller 103 performs control such that during startup, load 200 is driven by output transistor MPS and one of the two transistors. Controller 103 performs control such that after startup, load 200 is driven by output transistors MPS and MPL, and the two transistors. A variation as described below is also encompassed, without being limited to the embodiment described above.

It may be that N (N is a natural number equal to or greater than two) transistors other than output transistors MPS and MPL are disposed in parallel between power supply AVDD and output terminal OUT. Controller 103 performs control such that during startup, load 200 is driven by output transistor MPS and M (M is a natural number equal to or greater than one) transistor(s) of the N transistors. Controller 103 may perform control such that after startup, load 200 is driven by output transistors MPS and MPL and the N transistors.

Embodiment 6

Figure 15:
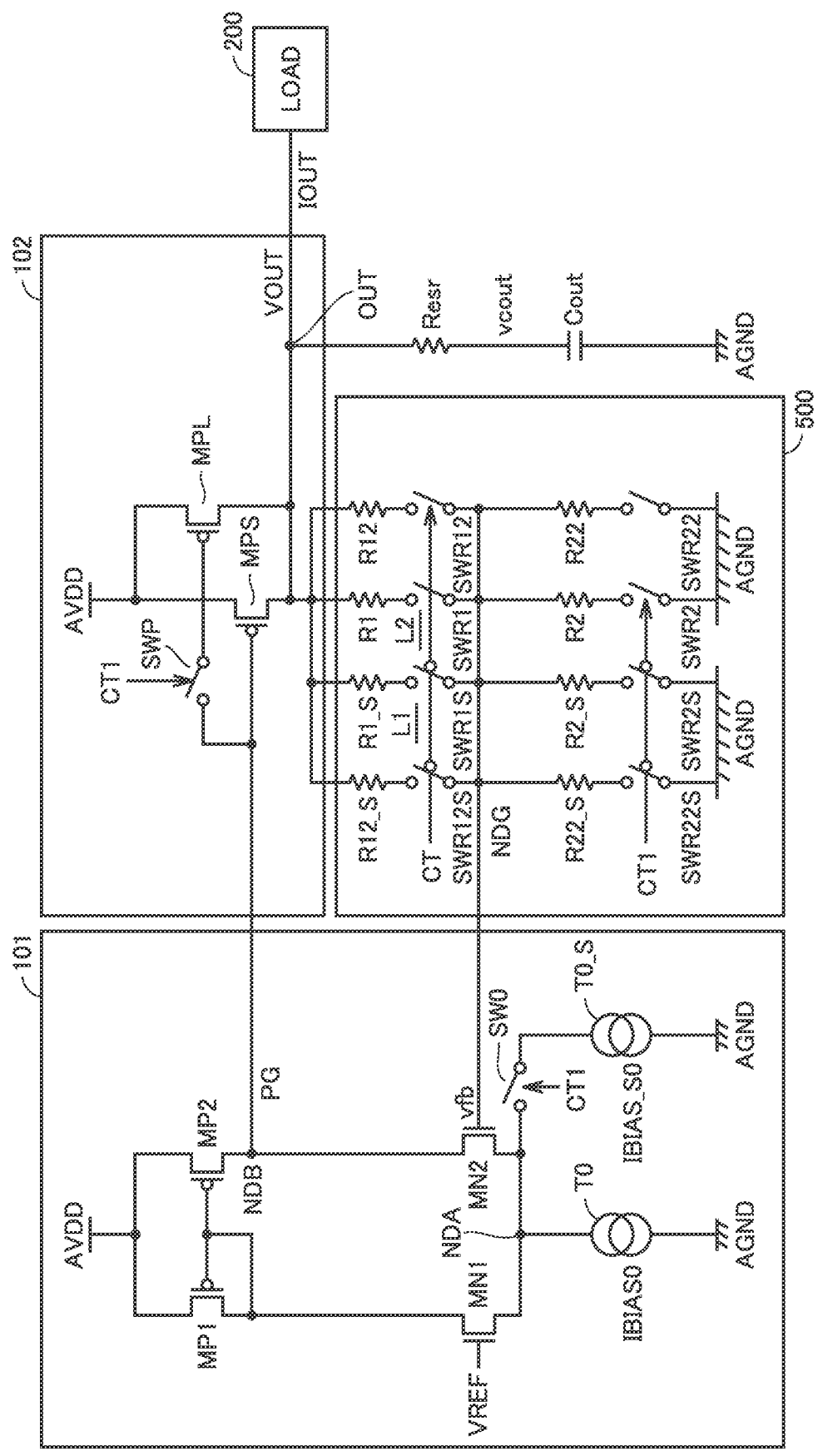
FIG. 15 is a diagram representing a configuration of an operational amplifier 520 in Embodiment 6.

FIG. 15 is a diagram representing a configuration of an operational amplifier 520 in Embodiment 6.

Operational amplifier 520 includes differential amplifying unit 101, output stage 102, and a feedback resistor unit 500.

Differential amplifying unit 101 and output stage 102 are similar to those described in Embodiment 1, and therefore will not be described again.

Feedback resistor unit 500 includes feedback resistors R1, R2, R12, R22, R1_S, R2_S, R12_S and R22_S, and switches SWR1, SWR2, SWR12, SWR22, SWR1S, SWR2S, SWR12S and SWR22S. Feedback resistor R1 has a higher resistance value than feedback resistor R1_S. Feedback resistor R2 has a higher resistance value than feedback resistor R2_S. Feedback resistor R12 has a higher resistance value than feedback resistor R12_S. Feedback resistor R22 has a higher resistance value than feedback resistor R22_S.

Resistor R1, switch SWR1, resistor R2, and switch SWR2 are connected in series between output terminal OUT and ground power supply AGND. Resistor R12, switch SWR12, resistor R22, and switch SWR22 are connected in series between output terminal OUT and ground power supply AGND.

Resistor R1_S, switch SWR1S, resistor R2_S, and switch SWR2S are connected in series between output terminal OUT and ground power supply AGND. Resistor R12_S, switch SWR12S, resistor R22_S, and switch SWR22S are connected in series between output terminal OUT and ground power supply AGND.

Switches SWR1, SWR2, SWR12 and SWR22 are controlled by startup completion control signal CT1. Switches SWR1, SWR2, SWR12 and SWR22 are turned on when startup completion control signal CT1 is at high level. Switches SWR1, SWR2, SWR12 and SWR22 are turned off when startup completion control signal CT1 is at low level.

Switches SWR1S, SWR2S, SWR12S and SWR22S are controlled by startup completion control signal CT1. Switches SWR1S, SWR2S, SWR12S and SWR22S are turned off when startup completion control signal CT1 is at high level. Switches SWR1S, SWR2S, SWR12S and SWR22S are turned on when startup completion control signal CT1 is at low level.

During startup, controller 103 turns off switch SW0, turns off switch SWP, turns off switches SWR1, SWR2, SWR12 and SWR22, and turns on switches SWR1S, SWR2S, SWR12S and SWR22S. The result is that the tail current is formed only by IBIAS0, and only output transistor MPS is driven. A current flows from output terminal OUT through resistors R1_S and R2_S, and through resistors R12_S and R22_S.

After startup, controller 103 turns on switch SW0, turns on switch SWP, turns on switches SWR1, SWR2, SWR12 and SWR22, and turns off SWR1S, SWR2S, SWR12S and SWR22S. The result is that the tail current is formed by IBIAS0+IBIAS_S0, and output transistors MPS and MPL are driven. A current flows from output terminal OUT through resistors R1 and R2, and through resistors R12 and R22.

In the embodiment described above, the feedback resistor unit includes two paths in addition to first path L1 and second path L2. Controller 103 performs control such that during startup, a current flows through first path L1 and one of the two paths, and a current does not flow through second path L2 and the other of the two paths. Controller 103 performs control such that after startup, a current flows through second path L2 and the other of the two paths, and a current does not flow through first path L1 and one of the two paths. One of the two paths has lower resistance than the other of the two paths. A variation as described below is also encompassed, without being limited to the embodiment described above.

The feedback resistor unit further includes N paths in addition to first path L1 and second path L2. Controller 103 performs control such that during startup, a current flows through first path L1 and M path(s) of the N paths, and a current does not flow through the second path and the remaining (N-M) path(s) of the N paths.

Controller 103 performs control such that after startup, a current flows through second path L2 and the remaining (N-M) path(s) of the N paths, and a current does not flow through first path L1 and M path(s) of the N paths. The M path(s) of the N paths have lower resistance than the remaining (N-M) path(s) of the N paths.

Embodiment 7

Figure 16:
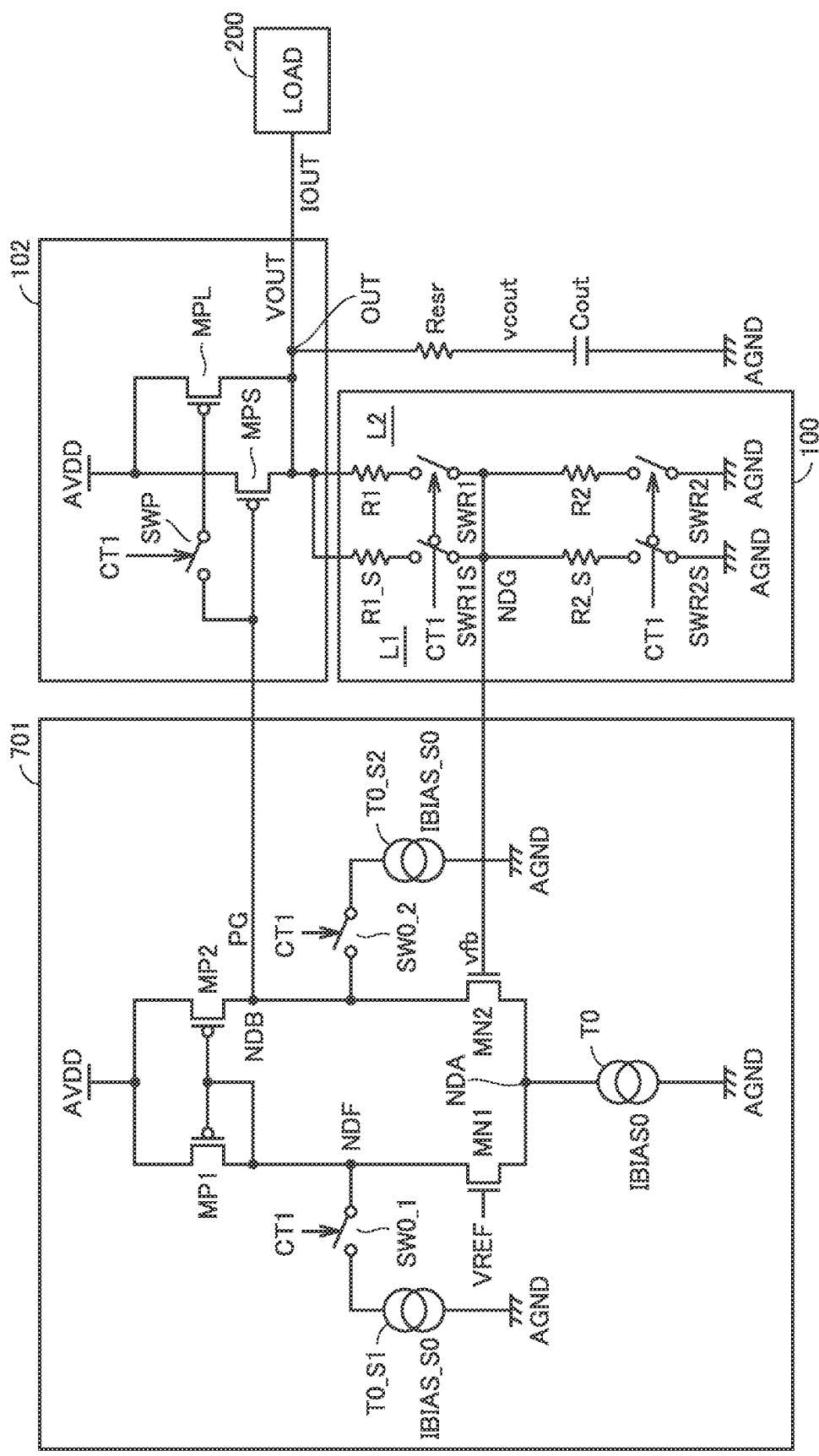
FIG. 16 is a diagram representing a configuration of an operational amplifier 720 in Embodiment 7.

FIG. 16 is a diagram representing a configuration of an operational amplifier 720 in Embodiment 7.

Operational amplifier 720 includes a differential amplifying unit 701, output stage 102, and feedback resistor unit 100. Output stage 102 and feedback resistor unit 100 are similar to those described in Embodiment 1, and therefore will not be described again.

Differential amplifying unit 701 includes, as in Embodiment 1, NMOS transistors MN1 and MN2 forming a differential pair, PMOS transistors MP1 and MP2 forming an active load, and tail current source T0.

Differential amplifying unit 701 further includes a tail current source T0_S1 (second tail current source), a tail current source T0_S2 (third tail current source), a switch SW0_1 (third switch), and a switch SW0_2 (fourth switch).

Switch SW0_1 and tail current source T0_S1 are connected in series between a node NDF to which the other end of NMOS transistor MN1 is connected, and ground power supply AGND. Tail current source T0_S1 outputs tail current IBIAS_S0.

Switch SW0_2 and tail current source T0_S2 are connected in series between node NDB to which the other end of NMOS transistor MN2 is connected, and ground power supply AGND. Tail current source T0_S2 outputs tail current IBIAS_S0.

To ensure that differential amplifying unit 701 operates, it is required that a current flowing through transistors MN1 and MN2 not become equal to or less than zero. For this purpose, the following condition needs to be satisfied:

$$IBIAS0 > 2 \times IBIAS\_S0 \quad (9)$$

Switches SW0_1 and SW0_2 are controlled by startup completion control signal CT1. Switches SW0_1 and SW0_2 are turned on when startup completion control signal CT1 is at high level. Switches SW0_1 and SW0_2 are turned off when startup completion control signal CT1 is at low level.

During startup, controller 103 turns off switches SW0_1 and SW0_2, turns off switch SWP, turns off switches SWR1 and SWR2, and turns on switches SWR1S and SWR2S. The result is that the tail current is formed only by IBIAS0, and only output transistor MPS is driven. A current flows from output terminal OUT through resistors R1_S and R2_S.

After startup, controller 103 turns on switches SW0_1 and SW0_2, turns on switch SWP, turns on switches SWR1 and SWR2, and turns off SWR1S and SWR2S. The result is that the tail current is formed by IBIAS0+2×IBIAS_S0, and output transistors MPS and MPL are driven. A current flows from output terminal OUT through resistors R1 and R2.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 100, 500, 600 feedback resistor unit; 101, 201, 301, 601, 701 differential amplifying unit; 102, 602 output stage; 103, 203 controller; 120, 220, 320, 420, 520, 620, 720 operational amplifier; 200 load; 210 voltage dividing unit; Cout output capacitance; MP1, MP2, MP3, MP4, MPS, MPL, MPS2, MPL2 PMOS transistor; MN1, MN2, M200 NMOS transistor; Rd1, Rd2, R1, R2, R1_S, RS_S, R12, R22, R12_S, R22_S resistor; T0, T0_S, T1, T1_S, T2, T2_S, T0_S1, T0_S2 tail current source; SWP, SWP2, SW0, SW1, SW2, SW0_1, SW0_2, SWR1, SWR2, SWR1S, SWR2S, SWR12, SWR22, SWR12S, SWR22S switch; BF, BF2 buffer; IV1, IV2, IV3, IV4 inverter; BI bias current source; C200 capacitance element; CMP comparator.

The invention claimed is:

1. A power supply circuit comprising:
a differential amplifying unit including a first input transistor and a second input transistor forming a differential pair, and a first tail current source and a second tail current source;
an output stage including a first output transistor and a second output transistor that can be driven by an output of the differential amplifying unit; and
a controller to perform control such that during startup, a load is driven by the first tail current source and the first output transistor, and such that after startup, the load is driven by the first tail current source, the second tail current source, the first output transistor, and the second output transistor.

2. The power supply circuit according to claim 1, wherein the first output transistor is smaller in size than the second output transistor.

3. The power supply circuit according to claim 1, wherein the output stage includes a first switch disposed between the output of the differential amplifying unit and a control electrode of the second output transistor, and
the controller turns off the first switch during startup, and turns on the first switch after startup.

4. The power supply circuit according to claim 1, wherein the differential amplifying unit includes
the first input transistor and the second input transistor,
the first tail current source and the second tail current source, and
a second switch,
one end of the first input transistor and one end of the second input transistor are connected to a first node,
the first tail current source is disposed between the first node and a second power supply,
the second switch and the second tail current source are connected in series between the first node and the second power supply, and
the controller turns off the second switch during startup, and turns on the second switch after startup.

5. The power supply circuit according to claim 1, wherein the differential amplifying unit includes
the first input transistor and the second input transistor,
the first tail current source and the second tail current source,
a third tail current source,
a third switch, and
a fourth switch,
one end of the first input transistor and one end of the second input transistor are connected to a first node,
the first tail current source is disposed between the first node and a second power supply,
the third switch and the second tail current source are connected in series between the other end of the first input transistor and the second power supply,
the fourth switch and the third tail current source are connected in series between the other end of the second input transistor and the second power supply, and
the controller turns off the third switch and the fourth switch during startup, and turns on the third switch and the fourth switch after startup.

6. The power supply circuit according to claim 1, wherein the first output transistor and the second output transistor are connected in parallel between a first power supply and an output terminal,
the power supply circuit comprises a feedback resistor unit to feed back a voltage determined by dividing a voltage of the output terminal to the differential amplifying unit, the feedback resistor unit including a first path and a second path, and
the controller performs control such that during startup, a current flows through the first path and a current does not flow through the second path, and performs control such that after startup, a current flows through the second path and a current does not flow through the first path, the first path having lower resistance than the second path.

7. The power supply circuit according to claim 6, wherein the feedback resistor unit includes
a first resistor and a second resistor disposed in parallel between the output terminal and a second node, and
a third resistor and a fourth resistor disposed in parallel between the second node and a second power supply,
a voltage of the second node is fed back to the differential amplifying unit,
the controller performs control such that during startup, a current flows through the first resistor and the third resistor on the first path and a current does not flow through the second resistor and the fourth resistor on the second path, and performs control such that after startup, a current flows through the second resistor and the fourth resistor on the second path and a current does not flow through the first resistor and the third resistor on the first path, and
the first resistor has a lower resistance value than the second resistor, and the third resistor has a lower resistance value than the fourth resistor.

8. The power supply circuit according to claim 7, wherein the feedback resistor unit includes
a fifth switch disposed between the first resistor and the second node,
a sixth switch disposed between the second resistor and the second node,
a seventh switch disposed between the third resistor and the second power supply, and
an eighth switch disposed between the fourth resistor and the second power supply, and
the controller turns on the fifth switch and the seventh switch during startup and turns off the fifth switch and the seventh switch after startup, and turns off the sixth switch and the eighth switch during startup and turns on the sixth switch and the eighth switch after startup.

9. The power supply circuit according to claim 6, wherein the controller includes
   a bias current source disposed between the first power supply and a third node,
   a drive transistor disposed between the third node and a second power supply,
   a capacitance element disposed between the third node and the second power supply, and
   a buffer to receive a voltage of the third node,
a control electrode of the drive transistor receives an input control signal, and
an output of the buffer controls switches included in the differential amplifying unit, the output stage, and the feedback resistor unit.

10. The power supply circuit according to claim 6, wherein
   the controller includes
      a voltage dividing circuit to divide a voltage to be supplied to the load,
      a comparator to compare an output voltage of the voltage dividing circuit with a reference voltage, and
      a buffer to receive an output of the comparator, and
   an output of the buffer controls switches included in the differential amplifying unit, the output stage, and the feedback resistor unit.

11. The power supply circuit according to claim 1, wherein
   the output stage further includes N output transistors that can be driven by the output of the differential amplifying unit, and
   the controller performs control such that during startup, the load is driven by the first output transistor and M output transistor(s) of the N output transistors, and such that after startup, the load is driven by the first output transistor, the second output transistor, and the N output transistors.

12. The power supply circuit according to claim 6, wherein
   the feedback resistor unit further includes N paths, and
   the controller performs control such that during startup, a current flows through the first path and M path(s) of the N paths and a current does not flow through the second path and remaining (N-M) path(s) of the N paths, and performs control such that after startup, a current flows through the second path and remaining (N-M) path(s) of the N paths and a current does not flow through the first path and M path(s) of the N paths, the M path(s) of the N paths having lower resistance than the remaining (N-M) path(s) of the N paths.

13. The power supply circuit according to claim 1, wherein
   the differential amplifying unit further includes
      N stages of amplifiers to receive an output of the differential pair, and
      a first group of N tail current sources each connected to a corresponding one of the amplifiers, and a second group of N tail current sources each connected to a corresponding one of the amplifiers, and
   the controller performs control such that during startup, the load is driven by the first tail current source and the first group of N tail current sources, and such that after startup, the load is driven by the first tail current source, the second tail current source, the first group of N tail current sources, and the second group of M (N≥M) tail current source(s) of the second group of N tail current sources.

14. The power supply circuit according to claim 5, wherein
   the first tail current source outputs a tail current of a first magnitude, the second tail current source outputs a tail current of a second magnitude, and the third tail current source outputs a tail current of the second magnitude, the first magnitude being greater than twice the second magnitude.

15. The power supply circuit according to claim 11, wherein
   the N output transistors are a third output transistor and a fourth output transistor,
   the first output transistor, the second output transistor, the third output transistor, and the fourth output transistor are connected in parallel between a first power supply and an output terminal,
   the output stage further includes
      a first switch disposed between the output of the differential amplifying unit and a control electrode of the second output transistor, and
      a second switch disposed between the output of the differential amplifying unit and a control electrode of the fourth output transistor,
   the controller turns off the first switch and the second switch during startup, and turns on the first switch and the second switch after startup, and
   the first output transistor is smaller in size than the second output transistor, and the third output transistor is smaller in size than the fourth output transistor.

16. The power supply circuit according to claim 12, wherein
   the N paths are a third path and a fourth path,
   the feedback resistor unit comprises
      a first resistor and a second resistor disposed in parallel between the output terminal and a second node,
      a third resistor and a fourth resistor disposed in parallel between the second node and a second power supply,
      a fifth switch disposed between the first resistor and the second node,
      a sixth switch disposed between the second resistor and the second node,
      a seventh switch disposed between the third resistor and the second power supply,
      an eighth switch disposed between the fourth resistor and the second power supply,
      a fifth resistor and a sixth resistor disposed in parallel between the output terminal and the second node,
      a seventh resistor and an eighth resistor disposed in parallel between the second node and the second power supply,
      a ninth switch disposed between the fifth resistor and the second node,
      a tenth switch disposed between the sixth resistor and the second node,
      an eleventh switch disposed between the seventh resistor and the second power supply, and
      a twelfth switch disposed between the eighth resistor and the second power supply,
   a voltage of the second node is fed back to the differential amplifying unit,
   the first resistor has a lower resistance value than the second resistor, the third resistor has a lower resistance value than the fourth resistor, the fifth resistor has a lower resistance value than the sixth resistor, and the seventh resistor has a lower resistance value than the eighth resistor, and the controller turns on the fifth switch, the seventh switch, the ninth switch and the eleventh switch during startup and turns off the fifth switch, the seventh switch, the ninth switch and the eleventh switch after startup, and turns off the sixth switch, the eighth switch, the tenth switch and the twelfth switch during startup and turns on the sixth switch, the eighth switch, the tenth switch and the twelfth switch after startup.

17. The power supply circuit according to claim 13, wherein
the differential amplifying unit includes
an amplification transistor of a first stage and an amplification transistor of a second stage as the N stages of amplifiers,
a third tail current source and a fourth tail current source as the first group of N tail current sources,
a fifth tail current source and a sixth tail current source as the second group of N tail current sources,
a thirteenth switch, and
a fourteenth switch,
the amplification transistor of the first stage is disposed between a first power supply and a fourth node,
the amplification transistor of the second stage is disposed between the first power supply and a fifth node,
a gate of the amplification transistor of the first stage is connected to the second input transistor,
a gate of the amplification transistor of the second stage is connected to the fourth node,
the fifth node is connected to the output stage,
the third tail current source is disposed between the fourth node and the second power supply,
the fourth tail current source and the thirteenth switch are connected in series between the fourth node and the second power supply,
the fifth tail current source is disposed between the fifth node and the second power supply,
the sixth tail current source and the fourteenth switch are connected in series between the fifth node and the second power supply, and
the controller turns off the thirteenth switch and the fourteenth switch during startup, and turns on the thirteenth switch and the fourteenth switch after startup.

* * * * *